(12) United States Patent
Rangarajan et al.

(10) Patent No.: US 6,612,319 B1
(45) Date of Patent: Sep. 2, 2003

(54) LOW DEFECT EBR NOZZLE

(75) Inventors: Bharath Rangarajan, Santa Clara, CA (US); Khoi A. Phan, San Jose, CA (US); Ursula Q. Quinto, San Jose, CA (US)

(73) Assignee: Advanced Micro Devices, Inc,, Sunnyvale, CA (US)

( * ) Notice: Subject to any disclaimer, the term of this patent is extended or adjusted under 35 U.S.C. 154(b) by 318 days.

(21) Appl. No.: 09/634,670

(22) Filed: Aug. 8, 2000

(51) Int. Cl.$^7$ ................................................. B08B 3/02
(52) U.S. Cl. ..................... 134/104.1; 134/30; 134/95.2; 134/95.3; 134/902
(58) Field of Search ........................ 134/30, 95.2, 95.3, 134/104.1, 902

(56) References Cited

U.S. PATENT DOCUMENTS

| | | | |
|---|---|---|---|
| 4,732,785 A | 3/1988 | Brewer | 427/240 |
| 5,392,989 A | 2/1995 | Hurtig | 239/119 |
| 5,444,921 A | 8/1995 | Milina | 33/833 |
| 5,756,155 A | 5/1998 | Tzeng et al. | 427/294 |
| 5,868,843 A | 2/1999 | Yang et al. | 118/504 |
| 5,952,050 A | 9/1999 | Doan | 427/336 |

*Primary Examiner*—Alexander Markoff
(74) *Attorney, Agent, or Firm*—Amin & Turocy, LLP

(57) ABSTRACT

An edge bead removal system and method is provided that employs a nozzle for applying edge bead removal solvent to an edge bead of a photoresist material layer disposed on a wafer. The nozzle includes a liquid chamber that can be connected to a supply of edge bead removal and an air supply chamber that can be connected to a supply of air. The supply of air is isolated from the liquid supply chamber during application of the edge bead removal solvent and communicates via the air supply chamber to the liquid supply chamber after application of the edge bead removal solvent thus removing any droplets of edge bead removal solvent remaining in the nozzle tip. A system is also provided that includes an absorbent material that moves from a rest position, during application of the edge bead removal solvent, to an absorbing position that removes or catches any droplets of edge bead removal solvent remaining on the nozzle tip after application of the edge bead removal solvent is completed. A nozzle is also provided that includes a liquid supply chamber with an inner cylindrical surface that is made of or coated with either a hydrophobic material and/or a hydrophilic material.

17 Claims, 5 Drawing Sheets

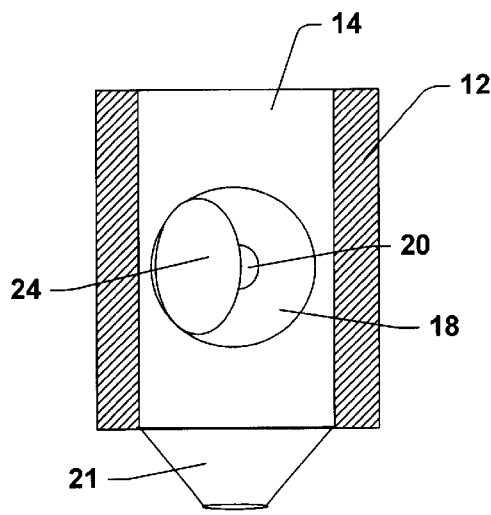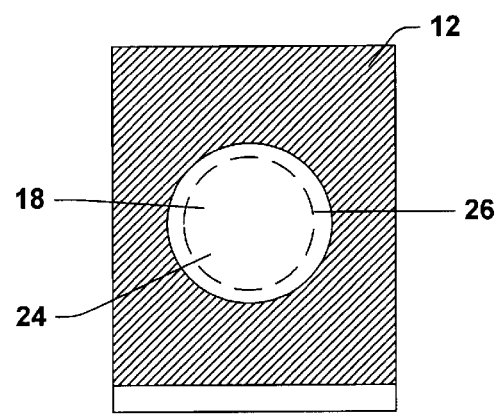
Fig. 3     Fig. 4
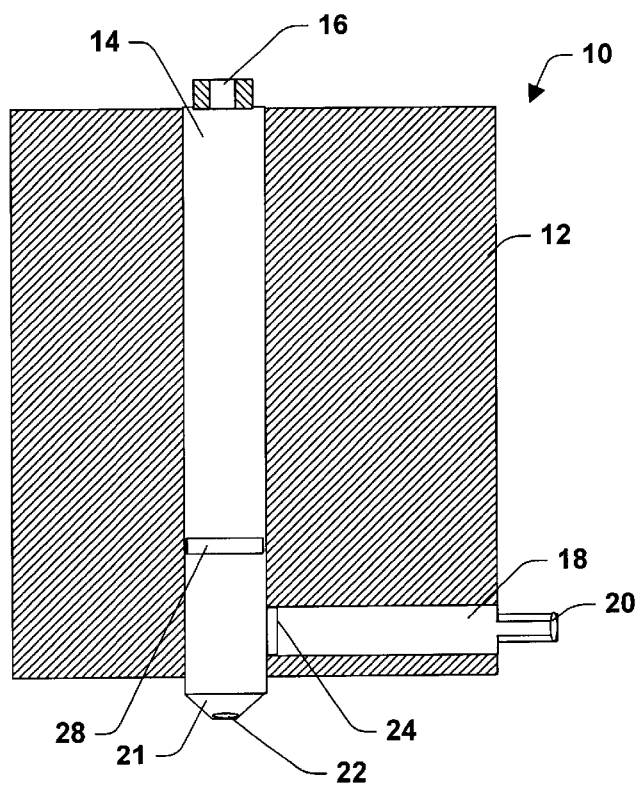
Fig. 5

LOW DEFECT EBR NOZZLE

TECHNICAL FIELD

The present invention generally relates to semiconductor processing, and in particular to a nozzle for applying an edge bead removal material to the edge of a photoresist material layer disposed on a semiconductor wafer.

BACKGROUND OF THE INVENTION

In the semiconductor industry, there is a continuing trend toward higher device densities. To achieve these high densities there has been and continues to be efforts toward scaling down device dimensions (e.g., at submicron levels) on semiconductor wafers. In order to accomplish such high device packing density, smaller and smaller features sizes are required. This may include the width and spacing of interconnecting lines, spacing and diameter of contact holes, and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon structure is coated uniformly with a radiation-sensitive film, the resist, and an exposing source (such as optical light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Due to the extremely fine patterns which are exposed on the photoresist material, thickness uniformity of the photoresist material is a significant factor in achieving desired critical dimensions. The photoresist material should be applied such that a uniform thickness is maintained in order to ensure uniformity and quality of the photoresist material layer. The photoresist material layer thickness typically is in the range of 0.1 to 3.0 microns. Good resist thickness control is highly desired, and typically variances in thickness should be less than ±10–20 Å across the wafer. Very slight variations in the photoresist material thickness may greatly affect the end result after the photoresist material is exposed by radiation and the exposed portions removed.

Application of the resist onto the wafer is typically accomplished by using a spin coater. The spin coater is essentially a vacuum chuck rotated by a motor. The wafer is vacuum held onto the spin chuck. Typically, a nozzle supplies a predetermined amount of resist to a center area of the wafer. The wafer is then accelerated to and rotated at a certain speed, and centrifugal forces exerted on the resist cause the resist to disperse over the whole surface of the wafer. The resist thickness obtained from a spin coating process is dependent on the viscosity of the resist material, spin speed, the temperature of the resist and temperature of the wafer.

After the photoresist is spin coated onto the wafer, a rim or bead of photoresist remains on the edge of the wafer. This rim or bead is removed by applying an edge bead removal solvent by using an edge bead removal (EBR) nozzle, so that loose particles from the rim or bead do not become a source of contamination that can cause wafer defects. Typically, the solvent is either applied at the bottom edge of the wafer, while the wafer is spun causing the solvent to wick around the edge and wash off the photoresist bead or the solvent is applied on the top outside edge of the wafer. However, applying the solvent to the top edge of the wafer has its own inherent problems. One of the problems is that when the solvent spray or jet is shut off, a drop of solvent can remain in a nozzle tip of the nozzle, and may free fall onto the wafer undesirably dissolving useful portions of the photoresist material layer, thus destroying the uniformity of the wafer ultimately causing wafer defects.

In view of the above, an edge bead removal nozzle is needed that ensures that droplets formed at a nozzle tip of the nozzle do not fall onto a photoresist material layer that is being worked upon.

SUMMARY OF THE INVENTION

The present invention relates to an edge bead removal system and method that employs a nozzle for applying edge bead removal solvent to an edge bead of a photoresist material layer disposed on a wafer. The edge bead removal solvent can be a developer, a rinse or a cleanser. The nozzle includes a liquid chamber that can be connected to a supply of edge bead removal solvent that the nozzle applies through a nozzle tip. The nozzle also includes an air supply chamber that can be connected to a supply of air. The supply of air is isolated from the liquid supply chamber during application of the edge bead removal solvent to the edge bead formed on the wafer. The supply of air communicates via the air supply chamber to the liquid supply chamber thus removing any droplets of edge bead removal solvent remaining in the nozzle tip after application of the edge bead removal solvent is completed. The supply of air can be either positive or negative or both depending on the specific configuration of the nozzle.

One particular aspect of the invention relates to an edge bead removal system that includes an edge bead removal nozzle and an absorbent material that moves from a rest position, during application of the edge bead removal solvent to the edge bead formed on the wafer, to an absorbing position that removes or catches any droplets of edge bead removal solvent remaining on the nozzle tip after application of the edge bead removal solvent is completed. In another aspect of the invention the nozzle includes a liquid supply chamber with an inner cylindrical surface that is rendered hydrophobic for repelling the solvent from the liquid supply chamber or hydrophilic for holding the solvent in the chamber after application of the solvent is completed. The surface can be rendered hydrophobic or hydrophilic by either being made of a hydrophobic or hydrophilic material or having a surface that is coated with a hydrophobic or hydrophilic material. For example, a hydrophobic material can be coated on the inner cylindrical surface of the liquid supply chamber near the nozzle tip, while a hydrophilic material can be coated on the remainder of the inner cylindrical surface of the liquid supply chamber, or a hydrophilic material can be coated on the inner cylindrical surface of the liquid supply chamber near the nozzle tip, while a hydrophobic material can be coated on the remainder of the inner cylindrical surface of the liquid supply chamber.

Another aspect of the present invention relates to an edge bead removal system for applying an edge bead removal solvent on an edge bead formed on a wafer by a photoresist material application system. The edge bead removal system is adapted to remove a droplet of edge bead removal solvent from a nozzle tip of an edge bead removal nozzle after the edge bead removal nozzle has completed application of the edge bead removal solvent. The system includes a supply of edge bead removal solvent, a supply of air, and an edge bead removal nozzle with a nozzle tip. The nozzle includes a liquid supply chamber adapted to be in fluid communication with the supply of edge bead removal solvent and an air supply chamber adapted to be in fluid communications with the supply of air. The edge bead removal nozzle has a first state for applying the edge bead removal solvent and a second state for removing the edge bead removal solvent from the nozzle tip. The air supply chamber is in fluid communication with the liquid supply chamber in the second state.

Another aspect of the present invention relates to an edge bead removal system for applying an edge bead removal solvent on an edge bead formed on a wafer by a photoresist material application system. The edge bead removal system is adapted to receive a droplet of edge bead removal solvent from a nozzle tip of an edge bead removal nozzle after the edge bead removal nozzle has completed application of the edge bead removal solvent. The system includes a supply of edge bead removal solvent, an edge bead removal nozzle with a nozzle tip. The nozzle is in fluid communication with the supply of edge bead removal solvent and adapted to apply edge bead removal solvent onto an edge bead formed on a wafer. The system also includes an absorbent material adapted to receive a droplet of edge bead removal solvent from the nozzle tip after the application of the edge bead removal solvent is completed.

Yet another aspect of the present invention relates to an edge bead removal system for applying an edge bead removal solvent on an edge bead formed on a wafer by a photoresist material application system. The system includes means for supplying an edge bead removal solvent, means for supplying air, and means for applying the edge bead removal solvent to an edge bead formed on a wafer. The means for applying the edge bead removal solvent includes a liquid supply path for moving the edge bead removal solvent from the means for supplying an edge bead removal solvent to the edge bead formed on the wafer and an air supply path for supplying a supply of air to the liquid chamber for removing an edge bead droplet formed on an end of the liquid supply path.

In yet another aspect of the invention an edge bead removal nozzle with a nozzle tip for applying an edge bead removal solvent on an edge bead formed on a wafer by a photoresist material application system is provided. The edge bead removal nozzle includes a liquid supply chamber adapted to be in fluid communication with a supply of edge bead removal solvent. The liquid supply chamber includes a first inner cylindrical surface made of a material that repels the solvent and a material that attracts the solvent.

Another aspect of the invention relates to a method for applying an edge bead removal solvent on an edge bead formed on a wafer by a photoresist material application system, and removing a droplet of edge bead removal solvent from a nozzle tip of an edge bead removal nozzle after applying the edge bead removal solvent. The method includes the step of providing an edge bead removal nozzle with a nozzle tip where the nozzle includes a liquid supply chamber adapted to be in fluid communication with a supply of edge bead removal solvent and an air supply chamber adapted to be in fluid communications with a supply of air. The edge bead removal nozzle has a first state for applying the edge bead removal solvent and a second state for removing the edge bead removal solvent from the nozzle tip. The air supply chamber is in fluid communication with the liquid supply chamber in the second state. The method further includes the steps of applying a supply of edge bead removal solvent to the edge bead formed on the wafer and providing a supply of air to the air supply chamber causing the removal of any remaining edge bead removal solvent from the nozzle tip of the nozzle.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 3 illustrates a cross-sectional view of the edge bead removal nozzle of FIG. 1 along the lines A—A in accordance with the present invention;

FIG. 4 illustrates a cross-sectional view of the edge bead removal nozzle of FIG. 1 along the lines B—B in accordance with the present invention;

FIG. 5 illustrates a cross-sectional view of the nozzle of FIG. 1 with a second flap in accordance with the present invention;

DETAILED DESCRIPTION OF THE INVENTION

Figure 1:
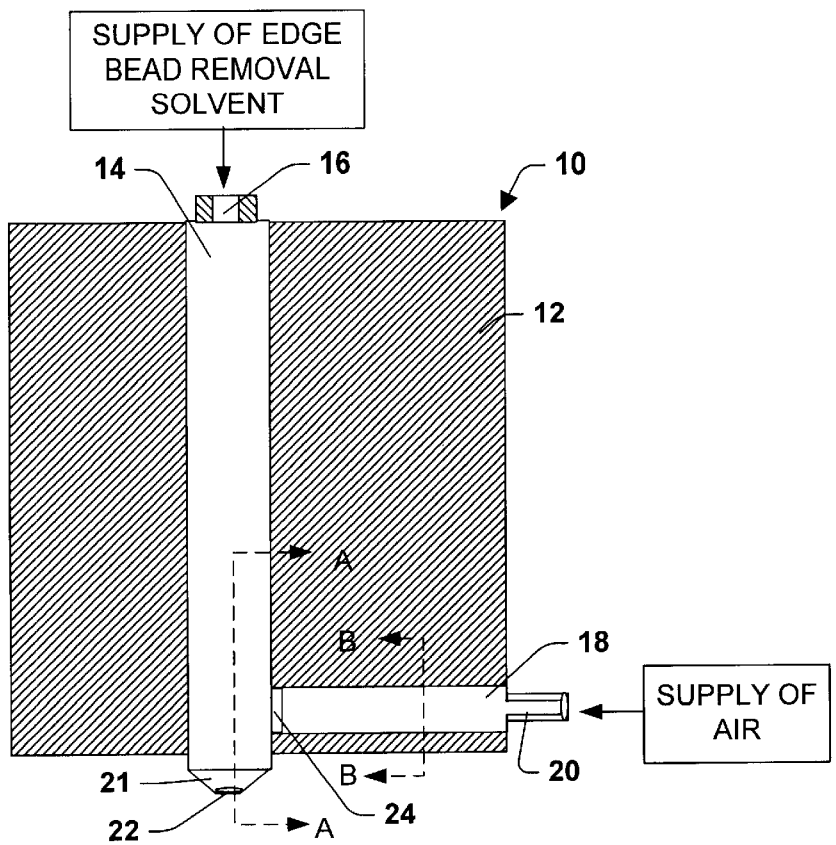
FIG. 1 illustrates a front cross sectional view of an edge bead removal nozzle in an edge bead removal system in accordance with the present invention.

The present invention is now described with reference to the drawings, wherein like reference numerals are used to refer to like elements throughout. The present invention is described with reference to an edge bead removal nozzle that employs various techniques for ensuring that droplets left in the nozzle, after application of an edge bead removal solvent on a wafer, do not fall onto the wafer. It should be understood that the description of these embodiments are merely illustrative and that they should not be taken in a limiting sense.

Referring initially to FIG. 1, an edge bead removal nozzle 10 is provided that includes a liquid chamber 14 surrounded by a housing 12. A liquid supply port 16 is connected at a first end of the liquid chamber 14. The liquid supply port 16 is connected to a supply of an edge bead removal solvent 15. The liquid chamber 14 extends through the housing from the first end to a second end that is provided with a liquid discharge aperture 22 for dispensing the edge bead removal solvent. An air chamber 18 is also provided and is in a communicative relationship with the liquid chamber 14. The air chamber 18 is disposed at a location near the liquid discharge aperture 22, and has a longitudinal axis that is generally perpendicular to the longitudinal axis of the liquid supply chamber 14. The air chamber 18 is connected on one end to an air supply port 20 that is connected to a supply of air 17. The supply of air 17 can be either a positive or negative (e.g. vacuum) supply depending on specific configuration of the nozzle 10. A flap 24 is disposed at the other end of the air chamber 18. The flap 24 controls the communication of air chamber 18 with the liquid chamber 14. The flap 24 is biased toward the liquid chamber 14, but is limited in its direction of travel by the air chamber 18. The flap 24 has a closed position during the dispensing of liquid, and an open position for removing excess liquid from a dispensing nozzle tip 21.

Figure 2:
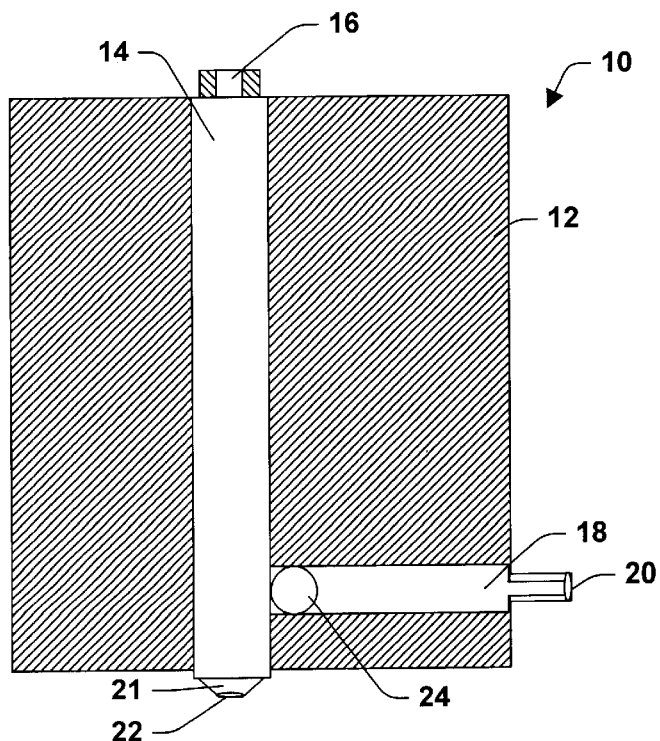
FIG. 2 illustrates a cross-sectional view of the edge bead removal nozzle of FIG.1 with a flap in an open position in accordance with the present invention.

FIG. 2 illustrates the flap 24 in its open position. After the nozzle 10 finishes dispensing the edge bead removal solvent, a supply of air of the negative or vacuum type is activated that is coupled to the air supply port 20 causing the flap 24 to open, which provides communication of the air supply port 18 with the liquid chamber 14. FIG. 3 illustrates a cross-sectional view of the liquid chamber of FIG. 1 along the lines A—A. In FIG. 3, the flap 24 is shown partially opened, revealing the air supply chamber 18 and the air supply port 20. The vacuum supply eventually causes the flap 24 to completely open, so that any remaining edge bead removal solvent in the liquid chamber 14 and the nozzle tip 21 is removed. FIG. 4 illustrates a cross-sectional view of the air supply chamber 18 of FIG. 1 along the lines B—B. The flap 24 is shown in its closed position and is limited in its length of travel by a peripheral flange 26 at the other end of the air chamber 18. This ensures that the flap 24 can only open into the air supply chamber 18 and not into the liquid supply chamber 14, so that the flap 24 does not interfere with the dispensing of edge bead removal solvent. In another embodiment, the opening and closing of the flap 24 is controlled electronically as opposed to by the supply of air.

An alternate embodiment of the nozzle of FIGS. 1–4 is illustrated in FIG. 5, where a second flap 28 is disposed in the liquid supply chamber 14 above the flap 24. The second flap 28 is biased to a closed position and moves toward its open position by pressure applied to it by the edge bead removal solvent. After the nozzle 10 finishes dispensing edge bead removal solvent, the second flap 30 returns to its closed position. The vacuum supply can then be activated causing the flap 24 to open, so that excess edge bead removal solvent can be removed. It is to be noted that the flap 24 and the second flap 28 can be biased in such a way that the second flap 28 does not open during the vacuum operation. In yet another embodiment, the air supply port 20 is connected to a supply of air for providing positive air flow through the air chamber 18. In this embodiment, the flap 24 can either be opened into the liquid supply chamber 14 or moved farther into the air chamber 18. The positive supply of air causes the excess edge bead removal solvent to flow out of the liquid discharge aperture 22. The positive supply of air can be turned on at or near the time the flow of the edge bead removal solvent is shut off, so that the edge bead removal solvent flow is continuous, until the nozzle tip 21 is emptied. The positive air flow also ensures that the second flap 28 remains closed during the removal or cleansing operation.

Figure 6:
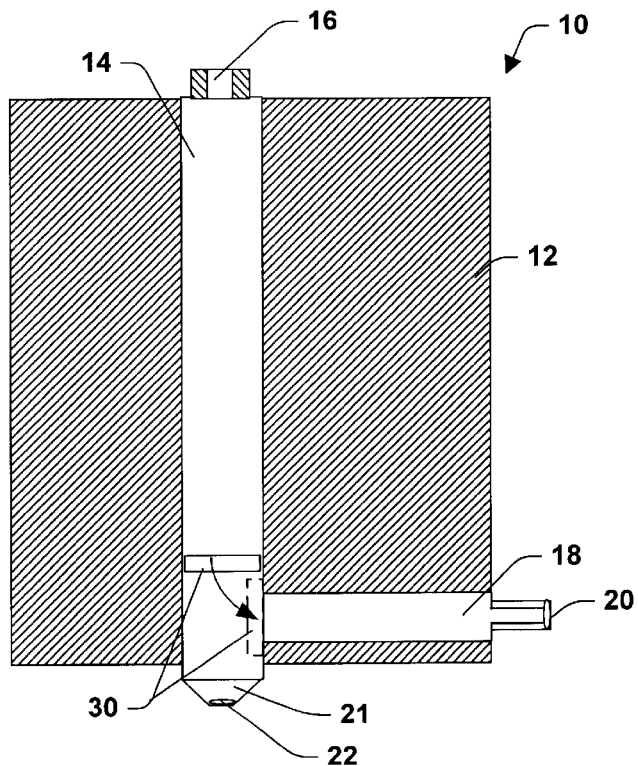
FIG. 6 illustrates a cross-sectional view of the nozzle of FIG. 1 with a movable flap in a liquid supply chamber in accordance with the present invention.

Another alternate embodiment of the edge bead removal nozzle is illustrated in FIG. 6. In the embodiment of FIG. 6, the nozzle includes a movable flap 30 disposed inside the liquid chamber 14. The movable flap moves between a first position closing off the liquid chamber 14 from the liquid discharge aperture 22, and a second position closing the air chamber 18 from the liquid chamber 14. In this embodiment, the air supply port 20 can be connected to a positive supply of air, so that the edge bead removal solvent can move the movable flap 30 to the second position during discharge of the solvent, and move the movable flap 30 to the first position during removal or cleansing of the residual solvent in the nozzle tip 21. It is to be appreciated that the air supply port 20 can be switch between both a positive supply of air and a negative supply of air. The positive supply of air can force the movable plate to its first position blocking any residual solvent remaining in the liquid chamber 14, while simultaneously forcing the residual solvent out of the nozzle tip 21. The negative supply of air can force the movable plate to its second position, so that the edge bead removal solvent can be dispensed with out interference of the movable flap 30, while simultaneously closing off the air chamber 18. It is to be appreciated that the flap 24 and/or the second flap 28 or the movable flap 30 can be located at a variety of different locations within the liquid supply chamber 14 and/or the air supply chamber 14, so that the present invention can be carried out with either a positive or negative air supply or both a positive and negative air supply.

Figure 7:
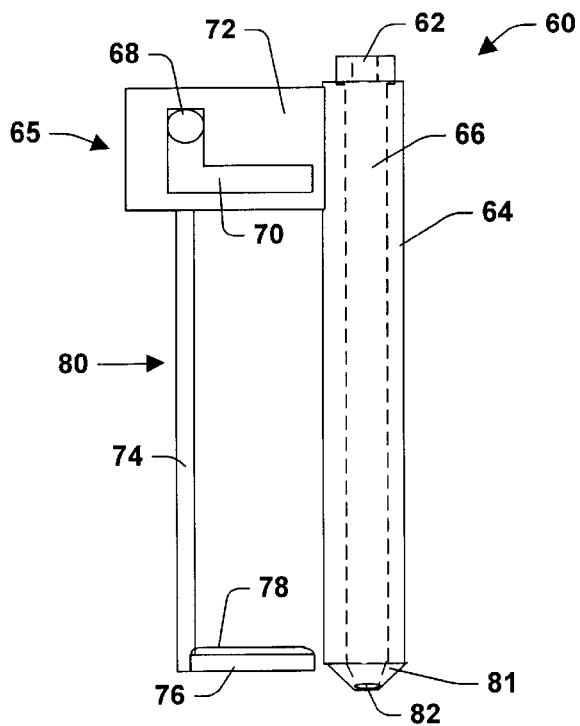
FIG. 7 illustrates a front view of an alternate nozzle in a rest state in accordance with the present invention.
Figure 8:
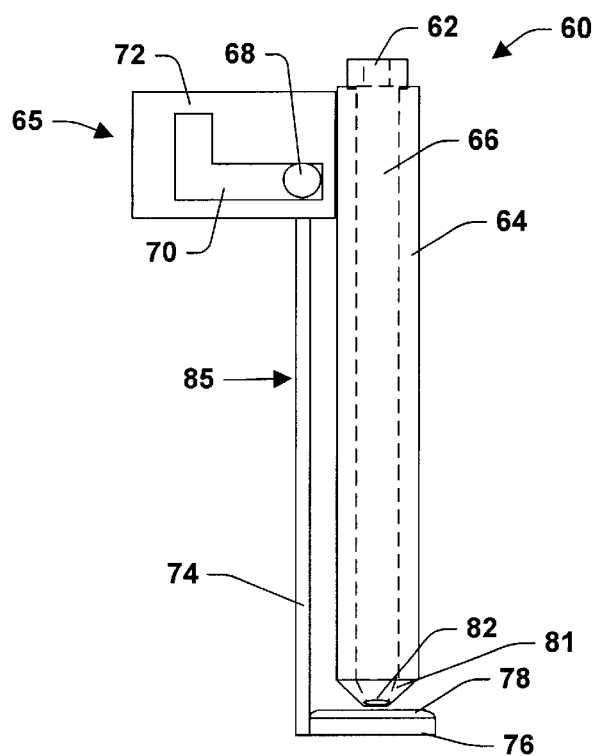
FIG. 8 illustrates a front view of the alternate nozzle of FIG. 7 in an operating state in accordance with the present invention.

Referring now to an alternate embodiment of the invention for removing excess edge bead removal solvent from the tip of a nozzle, FIGS. 7–8 illustrate a nozzle 60 that utilizes a material external to the nozzle 60 for absorbing droplets of edge bead removal solvent. The nozzle 60 includes a liquid chamber 66 surrounded by a housing 64. A liquid supply port 62 is connected at a first end of the liquid chamber 66. The liquid supply port 62 is adapted to be connected to a supply of edge bead removal solvent. The liquid chamber 66 extends through the housing from the first end to a second end that is provided with a discharge aperture 62 for dispensing the edge bead removal solvent. A moving mechanism 65 is provided that includes a holder 72 having a path 70 for moving a spherical ball bearing 68. A handle 74 connects the ball bearing 68 to a plate 76. An absorbing material 78 is disposed on top of the plate 76. The absorbing material 78 can be any sponge or cloth like material adapted to absorb droplets of edge bead removal solvent from a nozzle tip 81. The moving mechanism 65 moves the material 78 from a rest position 80, illustrated in FIG. 7, to an absorbing position 85, illustrated in FIG. 8. The absorbing material 78 is moved to the rest position 80, while edge bead removal solvent is being dispensed through a liquid discharge aperture 82 in the nozzle tip 81, and is moved to the absorbing position 85 immediately after the nozzle tip 81 terminates dispensing of the edge bead removal solvent. It is to be appreciated that a variety of moving mechanisms can be employed to move the absorbing material 78 from a rest position to an absorbing position, in addition to the example discussed above.

Figures 9, 10:
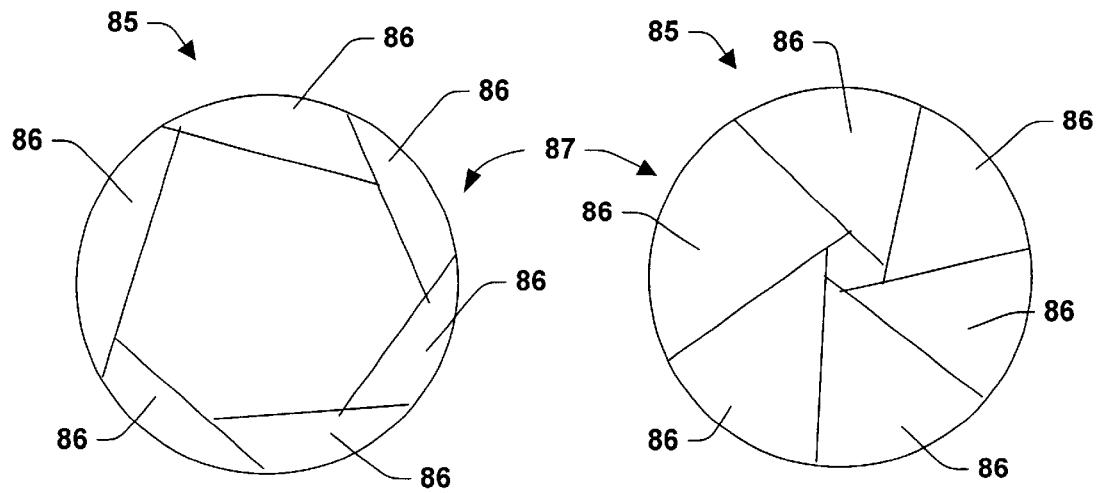
FIG. 9 illustrates a bottom view of an alternate nozzle tip in an open position in accordance with the present invention.
FIG. 10 illustrates a bottom view of the alternate nozzle tip of FIG. 9 in a closed position in accordance with the present invention.

FIGS. 9–10 illustrate an alternate nozzle tip 85 that can be employed in the nozzle 60. The alternate nozzle tip 85 is formed of a plurality of shutters 86 forming an iris 87 that moves from a open position as illustrated in FIG. 9 to a closed position as illustrated in FIG. 10. The shutters 86 are formed from or covered with an absorbent material, such that droplets are absorbed by the absorbent material after application of the solvent onto the wafer. This eliminates the need for using the moving mechanism 65 and the plate 76 illustrated in FIGS. 7 and 8.

Figure 11:
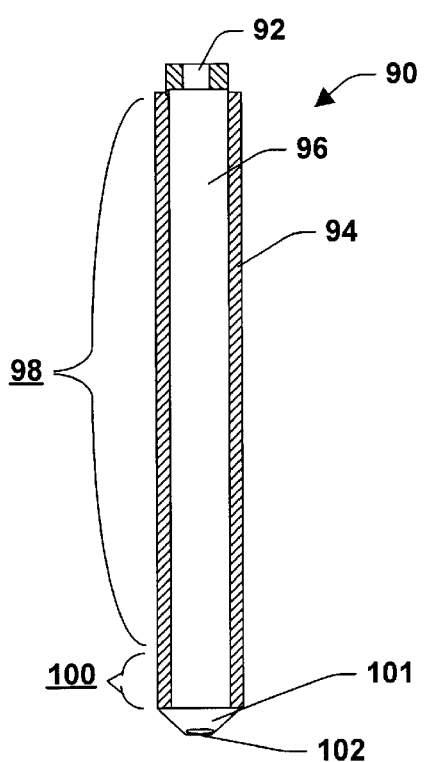
FIG. 11 illustrates a cross-sectional view of yet another embodiment of a nozzle in accordance with the present invention.
Figure 12:
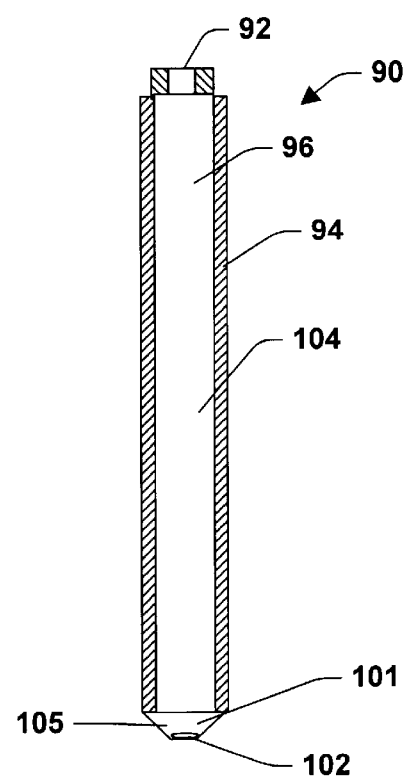
FIG. 12 illustrates a cross-sectional view of a variation of the nozzle in FIG. 9 in accordance with the present invention.

FIGS. 11–12 illustrate yet another alternate embodiment of the invention for removing excess edge bead removal solvent from the tip of an edge bead removal nozzle. A nozzle 90 is provided that includes a liquid chamber 96 surrounded by a housing 94. A liquid supply port 92 is connected at a first end of the liquid chamber 96. The liquid supply port 92 is adapted to be connected to a supply of edge bead removal solvent. The liquid chamber 96 extends through the housing 94 from the first end to a second end that is provided with a discharge aperture 102 for dispensing the edge bead removal solvent. Referring initially to FIG. 9, the liquid supply chamber 96 includes a first inner cylindrical surface 98 and a second inner cylindrical surface 100. The second inner cylindrical surface 100 is disposed at a location near the discharge aperture 102, and covers a much smaller area than the first inner cylindrical surface 98. If the solvent is aqueous, the first inner cylindrical surface 98 is made of or covered with a hydrophillic material and the second surface is made of or covered with a hydrophobic material. If the solvent is organic, the first inner cylindrical surface 98 is made of or covered with a lypophilic material and the second surface is made of a lypophobic material. The edge bead removal solvent is dispensed through the liquid supply chamber 14 by pressure. After the edge bead removal solvent supply is turned off, the residual edge bead removal solvent will be held on the first inner cylindrical surface 98, and repelled by the second inner cylindrical surface 100, so that no drops of edge bead removal solvent will be formed on a nozzle tip 101.

Alternatively, the first inner cylindrical surface 98 can be made of or coated with a hydrophobic material for aqueous solvents and lypophobic for organic solvents, while the second inner cylindrical surface 100 is made of or coated with a hydrophilic material for aqueous solvents and lypophilic for organic solvents. The residual edge bead removal solvent will then be repelled by the first inner cylindrical surface 98 and attracted or held by the second inner cylindrical surface 100. In this way, any residual edge bead removal solvent remains on the second inner cylindrical surface 100 and not form a droplet on the nozzle tip 101 that may fall onto the wafer being worked upon. An alternate embodiment is illustrated in FIG. 10, where the nozzle 90 includes the liquid supply chamber 96 which has a single inner cylindrical surface 104 made of or coated with either a hydrophobic or a hydrophilic material for aqueous solvents and either a lypophobic or lypophilic material for organic solvents. The single cylindrical surface 104 either repels or attracts any residual edge bead removal solvent, thus preventing any droplets of edge bead removal solvent from forming on the nozzle tip 101. Additionally the outside surface 105 of the nozzle tip 101 can be made of or covered with a hydrophobic material for aqueous solvents and lypophobic material for organic materials, while the single inner cylindrical surface is made of or covered with a hydrophilic material for aqueous solvents and a lypophilic material for organic solvents. This causes the droplets to be sucked back into the nozzle 90.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An edge bead removal system for applying an edge bead removal solvent on an edge bead formed on a wafer by a photoresist material application system, the edge bead removal system adapted to remove a droplet of edge bead removal solvent from a nozzle tip of an edge bead removal nozzle after the edge bead removal nozzle completes application of the edge bead removal solvent, the system comprising:

a supply of edge bead removal solvent;

a supply of positively or negatively pressurized air; and and an edge bead removal nozzle with a nozzle tip, the nozzle having a liquid supply chamber adapted to be in fluid communication with the supply of edge bead removal solvent and an air supply chamber adapted to be in fluid communications with the supply of positively or negatively pressurized air, the edge bead removal nozzle having a first state for applying the edge bead removal solvent and a second state for removing any edge bead removal solvent from the nozzle tip, wherein the air supply chamber is in fluid communication with the liquid supply chamber in the second state.

2. The system of claim 1, further including a flap disposed inside one of the liquid supply chamber and the air supply chamber and having a first position in the nozzle first state allowing application of the edge bead removal solvent and a second position in the nozzle second state allowing removal of any edge bead removal solvent from the nozzle tip.

3. The system of claim 2, wherein the flap is movable to the first and second positions within the air supply chamber.

4. The system of claim 3, further including an annular peripheral flange disposed in the air supply chamber for limiting the length of travel of the flap.

5. The system of claim 2, wherein the flap is movable to the first and second positions within the liquid supply chamber.

6. The system of claim 2, wherein the flap cuts off the air supply chamber from the liquid supply chamber in the first position and the flap cuts off the liquid supply chamber from the nozzle tip in the second position.

7. The system of claim 1, further including a first flap disposed in the air supply chamber and having a first position in the nozzle first state and a second position in the nozzle second state and a second flap having a first position in the nozzle first state and a second position in the nozzle second state.

8. The system of claim 1, wherein the supply of air provides a supply of negatively pressurized air.

9. The system of claim 1, wherein the supply of air provides a supply of positively pressurized air.

10. The system of claim 1, wherein the supply of air provides a supply of both negatively and positively pressurized air.

11. An edge bead removal system for applying an edge bead removal solvent on an edge bead formed on a wafer by a photoresist material application system, the system comprising:

means for supplying a edge bead removal solvent;

means for supplying positively or negatively pressurized air; and means for applying the edge bead removal solvent to the edge bead formed on the wafer, the means for applying the edge bead removal solvent including a liquid supply path for moving the edge bead removal solvent from the means for supplying an edge bead removal solvent to the edge bead formed on the wafer and an air supply path for supplying a supply of positively or negatively pressurized air to the liquid chamber for removing an edge bead droplet formed on an end of the liquid supply path.

12. An edge bead removal nozzle with a nozzle tip for applying an edge bead removal solvent on an edge bead formed on a wafer by a photoresist material application system, the edge bead removal nozzle comprising:

a liquid supply chamber adapted to be in fluid communication with a supply of edge bead removal solvent; and an air supply chamber adapted to be in fluid communications with a supply of positively or negatively pressurized air, the edge bead removal nozzle having a first state for applying the edge bead removal solvent and a second state for removing the edge bead removal solvent from the nozzle tip, wherein the air supply chamber is in fluid communication with the liquid supply chamber in the second state.

13. The system of claim 12, further including a flap disposed inside one of the liquid supply chamber and the air supply chamber and having a first position in the nozzle first state allowing application of the edge removal solvent and a second position in the nozzle second state allowing removal of the edge bead removal solvent from the nozzle tip.

14. The system of claim 13, wherein the flap is movable to the first and second positions within the air supply chamber, the flap being biased to the first position and moving to the second position upon the presence of a negatively pressurized air supply being in the air supply chamber.

15. The system of claim 13, wherein the flap is movable to the first and second positions within the liquid supply chamber, the flap being biased in the first position and moving to the second position upon the presence of a positively pressurized air supply being present in the air supply chamber.

16. The system of claim 13, wherein the flap cuts off the air supply chamber from the liquid supply chamber in the first position and the flap cuts off the liquid supply chamber from the nozzle tip in the second position.

17. The system of claim 12, further including a first flap disposed in the air supply chamber, the first flap having a first position in the nozzle first state and a second position in the nozzle second state and a second flap in the liquid supply chamber, the second flap having a first position in the nozzle first state and a second position in the nozzle second state.

* * * * *